United States Patent [19]
Grill et al.

[11] Patent Number: 5,579,430
[45] Date of Patent: Nov. 26, 1996

[54] DIGITAL ENCODING PROCESS

[75] Inventors: Bernhard Grill, Rednitzhembach; Karl-Heinz Brandenburg, Erlangen; Thomas Sporer, Fürth; Bernd Kürten; Ernst Eberlein, both of Grossenseebach, all of Germany

[73] Assignee: Fraunhofer Gesellschaft zur Foerderung der angewandten Forschung e.V., Munich, Germany

[21] Appl. No.: 380,135

[22] Filed: Jan. 26, 1995

Related U.S. Application Data

[63] Continuation of Ser. No. 169,768, Dec. 20, 1993, abandoned, which is a continuation of Ser. No. 768,239, filed as PCT/DE90/00286, Apr. 12, 1990, abandoned.

[30] Foreign Application Priority Data

Apr. 17, 1989 [DE] Germany ............... 39 12 605.6

[51] Int. Cl.$^6$ ............... G01L 3/02; G01L 9/00
[52] U.S. Cl. ............... 395/2.12; 395/2.09; 395/2.1; 395/2.91
[58] Field of Search ............... 381/36–53, 29, 381/31; 395/2, 2.87; 348/412

[56] References Cited

U.S. PATENT DOCUMENTS

| | | | |
|---|---|---|---|
| 4,270,025 | 5/1981 | Alsup et al. | 395/2.21 |
| 4,813,056 | 3/1989 | Fedele | 375/27 |
| 4,815,134 | 3/1989 | Picone et al. | 395/2.31 |
| 4,942,467 | 7/1990 | Waldman et al. | 348/412 |
| 4,972,484 | 11/1990 | Theile et al. | 395/2.36 |
| 5,031,038 | 7/1991 | Guillemot et al. | 358/133 |
| 5,136,613 | 8/1992 | Dumestre, III | 375/1 |
| 5,222,189 | 6/1993 | Fielder | 395/2.38 |
| 5,341,457 | 8/1994 | Hall, II et al. | 395/2.35 |

Primary Examiner—David K. Moore
Assistant Examiner—Tariq Hafiz
Attorney, Agent, or Firm—Evenson, McKeown, Edwards & Lenahan, P.L.L.C.

[57] ABSTRACT

A digital encoding process for transmitting and/or storing acoustical signals and, in particular, music signals, in which scanned values of the acoustical signal are transformed by means of a transformation or a filter bank into a sequence of second scanned values, which reproduce the spectral composition of the acoustical signal, and the sequence of second scanned values is quantized in accordance with the requirements with varying precision and is partially or entirely encoded by an optimum encoder, and in which a corresponding decoding and inverse transformation takes place during the reproduction. An encoder is utilized in a manner in which the occurrence probability of the quantized spectral coefficient is correlated to the length of the code in such a way that the more frequently the spectral coefficient occurs, the shorter the code word. A code word and, if needed, a supplementary code is allocated to several elements of the sequence or to a value range in order to reduce the size of the table of the encoder. A portion of the code words of variable length are arranged in a raster, and the remaining code words are distributed in the gaps still left so that the beginning of a code word can be more easily found without completely decoding or in the event of faulty transmission.

32 Claims, 2 Drawing Sheets

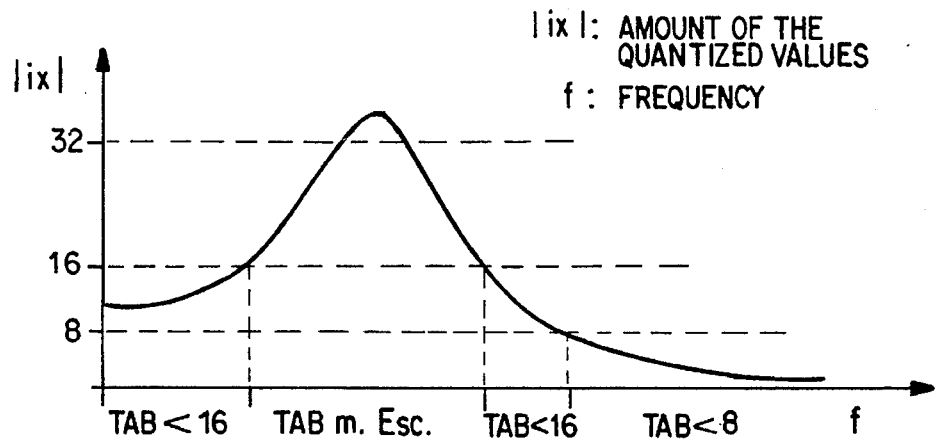

FIG. 1

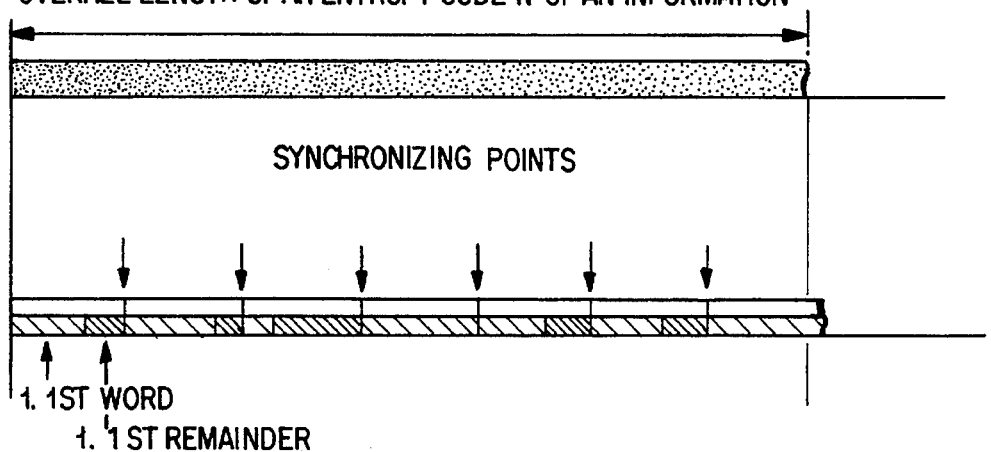

☐ Largest possible single word length equals synchronization frame

▨ 1st to N/Z word of an information beginning respectively after the length of the longest possible word ▨ Remainder left over per synchronization frame, which is filled with the remaining bits following the allocation of the sites having a defined beginning ▨ "extending" bits, which are arranged in the 1st remainder

FIG. 2

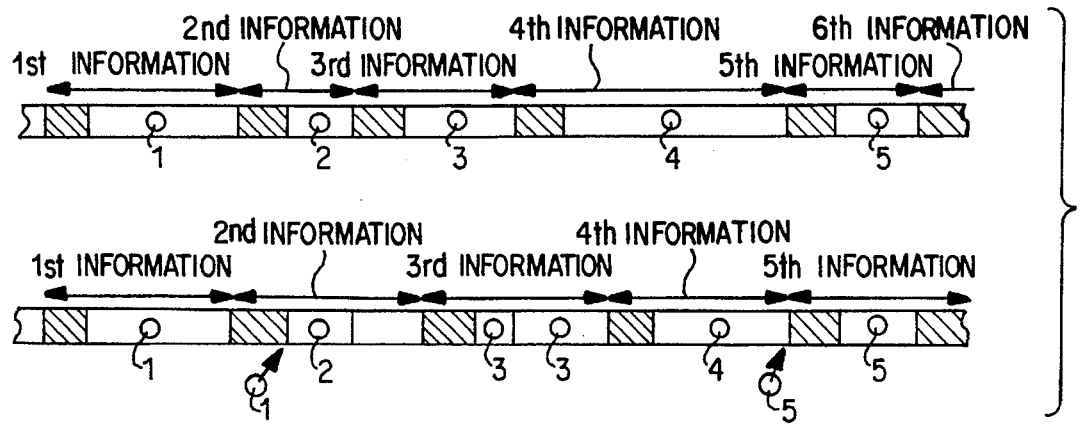
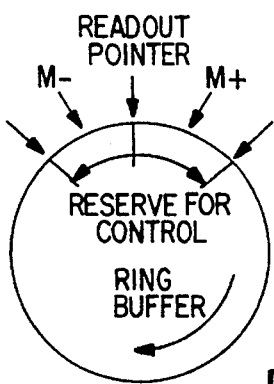
FIG. 4
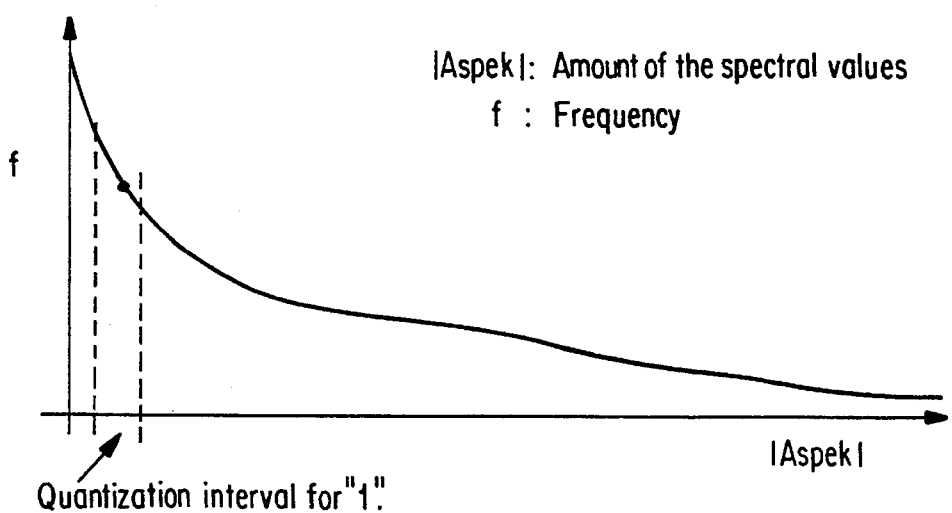
FIG. 5

DIGITAL ENCODING PROCESS

This application is a continuation of application Ser. No. 08/169,768, filed on Dec. 20, 1993, now abandoned, which is a continuation of application Ser. No. 07/768,239, filed as PCT/DE90/00286 on Apr. 12, 1990, which is now abandoned.

BACKGROUND AND SUMMARY OF THE INVENTION

The present invention relates to a digital encoding process for transmitting and/or storing accoustical signals and, in particular, music signals which scanned values of the acoustical signal are transferred by a transformation or a filter bank into a sequence of second scanned values which reproduce the spectral composition of the acoustical signal. The sequence of second scanned values is quantized in accordance with the requirements with varying precision and is partially or entirely encoded by an optimum encoder. A corresponding decoding and inverse transformation takes place during the transformation.

Processes such as those described above are known, by way of illustration, from DE-PS 33 10 480 or from WO 88/01811. Moreover, the cited publications are to be referred to for the explanation of all the terms not made more apparent herein.

In particular, the present invention relates to the OCF process, which was proposed for the first time in WO 88/01811.

The object of the present invention is to improve digital encoding processes and, in particular, the OCF process known from WO 88/01811 in such a manner that encoding of music of a quality comparable to compact-disc quality is possible at data rates of approximately 2 bit/ATW and of music of good FM-radio quality at data rates of 1.5 bit/ATW.

BRIEF DESCRIPTION OF THE DRAWINGS

FIG. 1 depicts a spectrum with a distinct maximum,

FIG. 2 depicts encoding words in a fixed raster,

FIG. 3 depicts the arrangement of important information portions in a fixed raster, FIG. 4 depicts schematically the ring buffer serving as the "bit bank", and FIG. 5 depicts the frequency distribution of the spectrum.

DETAILED DESCRIPTION OF THE DRAWINGS

The procedure with encoding processes for transmitting and/or storing accoustical signals and, in particular, music signals is usually as follows: first the scanned values of the accoustical signal are transformed into a sequence of second scanned values reproducing the spectral composition of the acoustical signal. This sequence of second scanned values is then quantized with varying precision and partially or completely encoded using an optimal encoder depending on the requirements. In reproduction, a corresponding decoding and reverse transformation takes place.

The translation of the scanned values of the acoustical signal into a sequence of second scanned values occur by means of a transformation or a filter bank, with the output signal of the filter bank, if need be, being "under"-scanned in such a way than a block is created as in a transformation.

An element of the present invention is, according to an embodiment of the present invention, that a known encoder, i.e. an encoding allocation, is used where the occurrence probability of the quantized spectral coefficient correlates with the length of the code in such a manner that the code word is shorter in proportion to the frequency of the spectral coefficient. Encoders of this type are, by way of illustration, as Huffman codes.

A further element of the present invention is that, in order to reduce the size of the table of the encoder, a code word and, if need be, a supplementary code is allocated either to several elements of the sequence or to a value range.

The joint encoding of spectral coefficients can take place in different ways: by way of ilustration, it can occur in the frequency range or in the time axis, with the same coefficients from successive blocks being encoded together. Furthermore, a code word can be allocated to a value range in a kind of rough quantization. A subrange may also be directly encoded, with the remainder of the value range being provided with a special identifier and in addition the offset being encoded up to the limit of the value range.

In this event, the code is usually taken from a table, the length of which corresponds to the number of code words. If a large number of code words with a word length, which is longer than the average length of a word, are of a similar length, all these code words can be described by a common identifier and a subsequent special code, which is adapted to the specific case of application, with minimum loss in encoding effectivity. This code may, by way of illustration, be a PCM code (pulse code modulanion). This process is especially efficient if only a few values possess a large occurrence probabilty as is, for example, the case when encoding music in spectral representation.

In the following section, this shall be made apparent using an example, with the following probability distribution being given:

| Value | Probability |
| --- | --- |
| 0 | 50% |
| 1 | 30% |
| 2 | 15% |
| 3 ... 15 | all together 5%, i.e. 0.38% each |

The entropy, i.e. the shortest possible mean code length is in this case 1.83275 bit.

In such a case of application, it is advantageous to determine a Huffman code containing the values 0,1,2 and an identifier (called ESC in the following section), in which the values 3 to 15 are encoded.

| Value | Huffman Code with ESC | Huffman Code without ESC |
| --- | --- | --- |
| 0 | 0 | 0 |
| 1 | 10 | 10 |
| 2 | 110 | 110 |
| 3 | 111 + 0011 | 111101 |
| 4 | 111 + 0100 | 111110 |
| 5 | 111 + 0101 | 111111 |
| 6 | 111 + 0110 | 1110000 |
| 7 | 111 + 0111 | 1110001 |
| 8 | 111 + 1000 | 1110010 |
| 9 | 111 + 1001 | 1110011 |
| 10 | 111 + 1010 | 1110100 |
| 11 | 111 + 1011 | 1110101 |
| 12 | 111 + 1100 | 1110110 |
| 13 | 111 + 1101 | 1110111 |

| Value | Huffman Code with ESC | Huffman Code without ESC |
|---|---|---|
| 14 | 111 + 1110 | 1111000 |
| 15 | 111 + 0111 | 1111001 |

A pure Huffmann encoding yields a mean code length of 1.89 bit, an encoding with ESC, on the other hand, yields a mean code length of 1.9 bit. The code efficiency is a little worse with the ESC encoding, but the size of the table for the encoder and the decoder is smaller by about the factor 4, so that the speed of the encoding and decoding process increases considerably.

If a modified PCM code is utilized as the code according to the ESC value, even values up to 18 can be encoded without changing the mean code length.

| Huffman Code with ESC |
|---|
| 0 |
| 10 |
| 110 |
| 111 + 0000 |
| 111 + 0001 |
| 111 + 0010 |
| 111 + 0011 |
| 111 + 0100 |
| 111 + 0101 |
| 111 + 0110 |
| 111 + 0111 |
| 111 + 1000 |
| 111 + 1001 |
| 111 + 1010 |
| 111 + 1011 |
| 111 + 1100 |
| 111 + 1101 |
| 111 + 1110 |
| 111 + 0111 |

An embodiment of the present invention provides an improvement according to which the n spectral coefficients are combined with $n \geq 2$ a n-tupel and are encoded together by means of an optimum encoder. Optimum encoders, which assign a code word of different length to each spectral value, are only in exceptional cases "optimum in the information theory sense". A further reduction of the code redundancy can be achieved by the invented encoding in that at least a pair of spectral values is allocated to a word. A decrease in redundancy results, firstly, due to the fact that both spectral values encoded together are not statistically independent, secondly due to the fact that a finer adaption of the code book, or of the code table, to the statistics of the signal can ensue by encoding pairs of values.

This shall be made more apparent in the following section using an example.

First an entropy encoder (optimum encoder), which allocates individual values to individual code words, is looked at:

| Data word | Frequency | Code word | Frequency * Code length |
|---|---|---|---|
| 0 | 70% | 0 | 0.7 |
| 1 | 30% | 1 | 0.3 |

A mean code word length of 1 is yielded.

Looking at the probabilities of pairs of scanned values yields the following optimum encoder:

| Data word | Frequency | Code word | Frequency * Code length |
|---|---|---|---|
| 00 | 50% | 0 | 0.50 * 1 |
| 01 | 20% | 10 | 0.20 * 2 |
| 10 | 20% | 110 | 0.20 * 3 |
| 11 | 10% | 111 | 0.10 * 3 |
| | | | = 1.8 |

The mean code word length per single value is yielded by the sum of the terms "frequency*code word length" divided by 2 (due to the encoding of pairs of values). In the example, it is 0.9. This is less than what can be attained by encoding single values and assuming the same signal statistics. Encoding pairs of spectral values occurs, e.g. by employing the first spectral value as the line number and the second value of a pair as the column number in order to address the respective code word in a code cable.

If the number of values encoded together is further increased, on the average a shorter code word length is yielded, e.g. for 4 tupel in which every value originates from the interval [0.1]:

| Data word | Frequency | Code word | Frequency * Code length |
|---|---|---|---|
| 0000 | 25% | 10 | 0.25 * 2 = 0.5 |
| 0001 | 10% | 000 | 0.1 * 3 = 0.3 |
| 0010 | 10% | 010 | 0.1 * 3 = 0.3 |
| 0011 | 5% | 11101 | 0.05 * 5 = 0.2 |
| 0100 | 10% | 011 | 0.1 * 3 = 0.3 |
| 0101 | 4% | 11100 | 0.04 * 5 = 0.2 |
| 0110 | 4% | 11001 | 0.04 * 5 = 0.2 |
| 1111 | 2% | 00100 | 0.02 * 5 = 0.1 |
| 1000 | 10% | 1111 | 0.1 * 4 = 0.4 |
| 1001 | 4% | 11011 | 0.04 * 5 = 0.2 |
| 1010 | 4% | 11010 | 0.04 * 5 = 0.2 |
| 1011 | 2% | 110001 | 0.02 * 6 = 0.12 |
| 1100 | 5% | 0011 | 0.05 * 4 = 0.2 |
| 1101 | 2% | 110000 | 0.02 * 6 = 0.12 |
| 1110 | 2% | 001011 | 0.02 * 6 = 0.12 |
| 1111 | 1% | 001010 | 0.01 * 6 = 0.06 |
| | | | 3.57 |

The mean code length in this example thus is 3.57/4=0.89

Furthermore, joint encoding can also be carried out, in accordance with another embodiment of the present invention by combining spectral coefficients of the same number from successive blocks and encoding them together. This will be made more apparent using an example, in which for reasons of simplicity two data blocks are encoded together; however, more data blocks can also be combined in the same manner.

$x(1), x(2), \ldots, x(n)$ are the frequency coefficients of a block, with $y(1), y(2), \ldots, y(n)$ the ones of the next block.

1) The spectral values to be encoded of two successive data blocks are encoded together. For this purpose, the quantized spectral value having the same number is taken from each of the two blocks and this pair is encoded, i.e. temporally successive values of the same frequency are encoded together. The correlation between these is very great in quasi-stationary signals, i.e. their value varies very little. Due to the joint encoding, the collateral quantization information is only required once for both data blocks.

The pairs $(x(1)\ y(1), (x(2)), \ldots, (x(n)\ y\ (n))$ being encoded together.

2) The values of two successive spectral values of a block are correlated together in the case of "even" spectra. For signals of this kind, it is useful to encode two spectral values of a block together.

The pairs (x(1) x(2)), (x(3)x(4)), ..., (x(n−1)x(n)) being encoded together. Depending on the transformation, other combinations of values are also useful.

3) Switching between 1) and 2) can, for example, be transmitted by an identification bit.

For more than two jointly encoded values, both possible ways can be combined: for 4-tupel, e.g. the following possible ways are useful:

a) one value each from four successive blocks b) two values each from two successive blocks c) four values from one block In cases a) and b) supplementary information can be reduced.

Naturally, the encoding cannot only occur by forming pairs or n-tupels of one spectral value of each data block or by forming n-tupels of more than one spectral value from each data block, but also by switching between pairs or n-tupels of successive data blocks and pairs or n-tupels of successive spectral values in the counting of frequency values in order to form pairs or n-tupels of spectral values.

In accordance with another embodiment of the invention, the following information should be considered. In the OCF processes described in WO 88/01811, separate values are transmitted from encoder to decoder for one factor of level control, for the number of iterations, which occurred in the inner loop, and for a measured value for the uneven spectral distribution (spectral flatness measure sfm). An element of the present invention is that a common "overall amplification factor" is determined from these values and transmitted to the receiver. The overall amplification factor is calculated by expressing all individual values as exponents of a specific numerical value and the factors are added to each other.

This shall be made more apparent in the following section using an example:

The following signal amplification operations are possible (a,b,c are integers):

1) Level adaption: amplification steps with $2^a$

2) Quantization:

a) Start value for quantizers in steps of $(\sqrt[4]{8})^b=1.682^b$ b) Roughening the quantizers in steps of $(\sqrt[4]{2})^c=1.189^c$ The quantization corresponds to a division, i.e. a diminishment. For this reason, factors formed in this manner have to be taken negatively.

The common factor herefor is therefore $f=\sqrt[4]{2}$.

for 1) $f^{4a}=2^a$ for 2a $f^{3b}=(\sqrt[4]{8})^b$ for 2b $f^c=(\sqrt[4]{2})^c$ The overall amplification factor is therefore $f^{4a-3b-c}$, only the integer exponent is transmitted to the decoder. The number of required bits is determined by the word length of the input data (in general 16 bit) and the transformation length (results in maximum dynamics).

Furthermore, variable data rates may be assigned to the supplementary information.

The correction factors, which make it possible to remain within the permissible level of disturbance, have to be transmitted to the receiver as supplementary level information per frequency group. An element of the present invention is that a reduction of the mean data rates required for this purpose is achieved by encoding the length of the succeeding data words in one trigger word and only utilizing the word length necessary for the respective transmission. This also will be made more apparent in the following section using an example:

The assumptions being: the number of frequency groups: 3 maximum number of iterations 8

Transmitted are the number of amplifications per frequency group. Without the variable data rate of the supplementary information 3*3=9 bit would be required. The maximum number of amplifications (in the example) are encoded as follows:

| no amplification | 0 |
| at most one amplification | 1 |
| at most three amplifications | 2 |
| at most seven amplifications | 3 |

The respective code word directly gives the number of bits required in order to encode the maximum amplification value.

The result of the psychoacoustical iteration loop is (0 0 2) in the example, i.e. the frequency group 3 was amplified twice, the other frequency groups were not. This can be encoded with the following bit sequence:

10 00 00 10, thus altogether 8 bits.

In accordance with an embodiment of the present invention, an encoder operating according to a so-called Huffman code is also employed in an as such known manner. An element of the present invention is that now, however, n-code tables with $n \geq 1$ and with varying length are utilized, which are adapted to the respective acoustical signal to be encoded. The number of the used code table is transmitted, or stored, with the coded values.

The mean code length, namely, depends on the number of different characters in the code. For this reason, it is useful to select a Huffman code which does not contain more than the required number of values. If one chooses the maximum value to be encoded as the criterium for selection for the code table, all the currently present values can be encoded.

If several code books, or code tables, are at disposal, the best table can be chosen using the values to be encoded and the code-table number can be transmitted as supplementary information. A pre-selection from the code tables may occur via the maximum value to be encoded.

Just to round things off, it must be added that, by way of illustration, very rough spectra like those generated by brass wind-instruments have different statistics, in which small values occur more frequently than even spectra like those generated by string instruments or wooden wind-instruments.

An embodiment of the present invention provides an improvement, in which different spectral ranges are allocated to different code tables in addition to or in place of the afore-mentioned allocation to various tables. In the case of spectra with a distinct maximum, it is, namely, a gain to divide the maximum into separate ranges and to select an optimum Huffman code for each section.

FIG. 1 shows a spectrum of this type, in which the maximum of the spectrum is about in the center of the spectral range. Here, by way of illustration, the range can be divided into four ranges.

In the first range, a Huffman code having 16 values is used, in the second a code having more than 32 values, in the third a code having again 16 values and in the fourth range a code having 8 values. It is advantageous if in the case of the code table having more than 32 values a table is employed, in which the code words having greater word lengths than the average word length are described by a common identifier and a succeeding PCM code. This is designated with "TAB having ESC" in FIG. 1.

In the illustrated example, the Huffman codes are selected according to the maximum of the sections, the codes being respectively available for 2,4,8 values, etc. Without this separation, the code for more than 32 values would have to be applied to the entire spectrum so that the required bit number for the block would be distinctly higher.

The points of separation and the code-table number for each section have to be transmitted as supplementary information.

The selection of Huffman codes for each section may occur, in particular, such that spectral coefficients having the same number are combined from at least two successive blocks to form a pair, respectively a n-tupel, and are encoded together by giving a code word.

Another embodiment of the invention provides an advantageous method of decoding the previously mentioned Huffman codes. For this purpose, the tree yielded in making the code is reproduced. Due to the condition that no code word may be the beginning of another code word, there is only one possible path from the "root" to the corresponding code word. In order to arrive at the code word, starting at the beginning, a bit of the code word is employed in each case to determine the path in the event of branching in the tree. The practical realization occurs by means of a table of pairs of addresses which are worked down always starting with the first pair. The first value of the pair contains the address of the next branch, which in the case of a "0" is to be selected in the value to be decoded, the second value the address of the branch in the case of a "1". Each address is marked as an address. If a value of the table is arrived at without this marking, a code word has been reached. In this event the value of the table corresponds to the value to be decoded. The succeeding bit to be decoded is consequently the first bit of the succeeding code word. Beginning with this another run through the table starting from the first pair of addresses commences.

In the following section, an example herefor shall be made more apparent:

| Value | Huffman Code | Code Tree |
|---|---|---|
| 0 | 00 | K0 |
| 1 | 01 | K1, K2 |
| 2 | 100 | |
| 3 | 101 | 0  1 |
| 4 | 1100 | K3  K4 |
| 5 | 1101 | |
| 6 | 1110 | 2  3 |
| 7 | 1111 | K5  K |
| | | 4  5  6 |

| Decoding Table | | | | | | | |
|---|---|---|---|---|---|---|---|
| &0 | &1 | &2 | &3 | &4 | &5 | &6 | &7 |
| &1/&4 | &2/&3 | 0/— | 1/— | &5/&8 | &6/&7 | 2/— | 3/— |
| &8 | &9 | &10 | &11 | &12 | &13 | &14 | |
| &9/&12 | &10/&11 | 4/— | 5/— | &13/&14 | 6/— | 7/— | |

The character & stands for an address.

| Decoding Example: | | 1101 = 5 | |
|---|---|---|---|
| &0 | 1 | ⇒ | &4 |
| &4 | 1 | ⇒ | &8 |

| | | | |
|---|---|---|---|
| &8 | 0 | ⇒ | &9 |
| &9 | 1 | ⇒ | &11 |
| &11 | | ⇒ | No address |
| | | ⇒ | dec. value = 5 |

In the event that a Huffman code of pairs of values was compiled, the corresponding second value can be accommodated at the second, in the above example, unoccupied site of the table. Accordingly, this process can also be utilized for decoding Huffman codes, which encode more than two values together.

In the case of encoding, in which the beginning of a code word is only determined by the end of the preceding code word (as by way of illustration is the case with the Huffman code), a transmission error will lead to a propagation of the error.

A solution to this is provided by an embodiment of the present invention. This solution may, of course, also be utilized independently of other features: in order to do this a portion of the code words are first arranged in a raster, the length of which, by way of illustration, is larger or the same length as the longest code word. Thus no error propagation occurs in this portion of the code words as their beginning no longer is determined by the end of the preceding code word. The remaining code words are distributed in the gaps still left. An example of this is depicted in FIG. 2. If the employed code table is set up in such a manner, the range of the code table can be deduced from the first positions of the code words. Thus the length of the raster used may also be less than the length of the longest code word. The positions, which do not fit into the raster are distributed like the remaining code words in the gaps still left. This shorter raster length permits arranging more code words in this raster and limiting error propagation to the last positions of these code words, which are only of secondary significance due to the above-described structure of the code table. This resorting does not result in any diminishment of the efficiency of the code.

This too shall be made more apparent in the following section using an example:

| Value | Code word |
|---|---|
| 0 | 0 |
| 1 | 100 |
| 2 | 101 |
| 3 | 110 |
| 4 | 111 |

The first two positions already decide whether the value is from the "0", "1–2", or "3–4" range. For this reason, a raster length of 2 is selected. The following value sequence is to be transmitted in code:

| Value sequence | 2 | 0 | 4 | 0 |
|---|---|---|---|---|
| Code words | 101 | 0 | 111 | 0 | without code sorting, a bit error in the first bit results in the following bit sequence

|  | 001 | 0 | 111 | 0 |
|---|---|---|---|---|
| broken down thus | 0 | 0 | 101 | 110 |
| decoded | 0 | 0 | 2 | 3 | code sorting (raster length 2) results in the following bit sequence

|  |  |  |  |  |
|---|---|---|---|---|
| first | 10 | 0 | 11 | 0 |
| remainder | 1 |  | 1 | 0 |
| remainder in gaps | 10 | 0 1 | 11 | 0 1 | a bit error in the first bit results in the following bit sequence

|  | 00 | 01 | 11 | 01 |
|---|---|---|---|---|
| range | 0 | 0 | 3–4 | 0 | i.e. the range could no longer be correctly decoded only for the disturbed code word.

Furthermore, according to an embodiment of the present invention, important information portions can be arranged in a fixed raster.

The reliability of the transmission of continuously successive information of varying length having portions of information of varying importance can be improved in the following manner: the mean length of information of the continuous bit stream represents the distance of the points of an equidistant raster. The important portions of information are then arranged in this fixed raster. In addition the position of the corresponding less important portion is transmitted in this important portion of information. The equidistance of the important information facilitates new synchronization in the event of a transmission error.

Error limitation in entropy codes as provided in another embodiment of the present invention shall be made more apparent in the following.

In the event of a bit error in the entropy code, usually all the information following the error position is lost when an error occurs. By marking the beginning of the block with a specific bit configuration and additionally transmitting the length of the entropy code, the resulting error can be limited to the block of information containing the bit error. This happens in the following manner.

After successfully decoding an item of information, the beginning of the succeeding block of information and therewith the marking of the beginning of a block would have to follow. If this is not the case, a check is run with the aid of the length of the entropy code whether the decoding is at the anticipated position according to the length of the entropy code. If this is the case, an error in the marking of the beginning of a block is assumed and corrected. If this is not the case, a check is run whether there is a marking of the beginning of a block at the bit stream position given by the length of the entropy code, which then with great probability marks the beginning of the next block. If no marking of a beginning of a block is encountered, there are at least 2 errors (decoding/block beginning marking or entropy code length/decoding or block beginning marking/entropy code length) and a new synchronization must be conducted.

Moreover, according to another embodiment of the invention, synchronization protection, or synchronization detection may be provided.

With continuous data streams composed of blocks of varying length there is the problem than synchronizing words for marking the beginning of the block may also by chance be in the data stream. Although the selection of very long synchronizing words reduces this probability, it can, however, for one not reduce it to zero and secondly leads to a reduction of the transmission capacity. A pair of circuits, which attaches a "1" to a synchronizing word found at the beginning of a block and a "0" to one found within a block (or the reverse—a "0" at the beginning of a block and otherwise a "1"), is known from the literature (e.g. intel "BITBUS"-frameformat). An element of the present invention is the utilization of encoded musical signals for transmission. Adapted to this utilization, the "synchronization identification" includes the possibility, in ranges in which a synchronizing word is anticipated, to accept this as such even if it were altered in some positions due to transmission errors.

An embodiment of the invention sets forth the limitation of the maximum number of iterations:

The goal is the limitation of the bits to be transmitted for marking the quantizer. Based on a quantizer starting value only a limited deviation from this starting value is permitted, which may be represented with n bits. In order to meet this condition, a check is made prior to each run through the outer loop whether it is still ensured that another inner loop call can be ended with a valid result.

This too shall be made more apparent in the following section using an example:

Based on a quantizer starting value, the quantizer is altered in steps from $q={}^4\sqrt{2}$. In the most unfavorable case, all frequency groups in the outer loop are amplified by the factor 2. If another four amplifications of the quantizer by $q={}^4\sqrt{2}$ are possible, it is ensured that the inner loop is ended with a result which fits into the permitted bit frame. For transmission, 5 bits are provided for the deviation from the starting value, so that maximally 31 is possible as the deviation from the starting value. The inner loop is thus no longer called if 28 or more has already been reached, as in this case it can no longer be ensured that the block can be encoded with the permissable number of bits.

Certain embodiments of the present invention, improve the psychoacoustics by utilizing psychoacoustic measures for several blocks.

The process employed in accordance with the present invention shall be made more apparent using an example. In order to keep the example simple, the number of the frequency groups will be assumed to be 2. The values for the respective permitted disturbance, etc., are also example values, which may be selected differently in the practical performance of the encoding process:

Assuming the permissible disturbance=0.1*signal energy per frequency group. The energy values are given without measurement data. The scale may selected at random as only the proportion data and and not the absolute amount of the energy values are utilized.

|  | Frequency group | Energy | Permissible disturbance |
|---|---|---|---|
| First block: | FG 1: | 50. | 5. |
|  | FG 2: | 60. | 6. |
| Second block | FG 1: | 1000. | 100. |
|  | FG.2: | 100. | 10. |

The "omission factor", which takes into consideration that the signal energy of the respective preceding block, is reflected less in the calculation of the current permissible disturbance than the signal energy of the current block, is selected with 2. The permissible disturbance in the second block is then calculated as the minimum permissible disturbance calculated from the data of the second block and from the data of the first block, corrected by the omission factor. Yielded in the example for the second block for frequency group FG 1 is:

for FG 1 min (2*5.100 )=10 and
for FG 2 min(2*6,10)=10 as the permissible disturbance.

Another embodiment of the invention provides a "bit bank": The simplest case has already been described in WO 88/01811, a specific data rate (number of bits) is made available for each block. In so far as the entire data rate is not completely utilized for encoding the block, the "remaining" bits of the number of bits at disposal for the next block are added to it.

A maximum bottom and top deviation from the sum of the data rate are permitted in the invented extension of this process. The deviation from the sum of the data rate (deviation of the sum of the number of bits of the data blocks from the sum of the number of bits, which can be calculated from the desired constant data rate) is referred to as "bit bank".

The bit bank is filled by the respective incomplete utilization of the current number of bits at disposal during normal operation. As long as a top limit of the bit bank (=bottom limit of the deviation of the sum of the number of bits) is not reached, only the number of bits, which can be calculated from the mean data rate, is again put at disposal to each block, but not, however, the "remaining" bits in the respective preceding block.

If, e.g. in the event of a sharp rise in the signal level (e.g. triangle), a distinctly lower permissible disturbance is calculated for a data block due to the reflection of the permissible disturbance of the last block (see above) than would be the case if the data of the last block were not taken into account, more bits are put at disposal to the inner iteration loop of the current block for encoding and the value of the deviation from the sum (bit bank) is corrected accordingly. The number of additional bits is selected in such a manner that the maximum deviation from the sum ("minimum amount in the bit bank") cannot be exceeded. In the above example, the number of additional bits may be calculated, by way of illustration, as follows:

In the first frequency group of the second block, the permissible disturbance would be =100., if the data of the first block were not taken into account. The ratio between the permissible disturbance with or without reflection of the data of the last block is thus 100/12=8.33, that is approximately 10*log (8.33)=9.2 dB.

Assuming that the quantization noise is reduced by approximately 6 dB when quantizing with an additional bit per value, approximately 1.5 bits are required per spectral value of the frequency group in order to attain the lower permissible disturbance. The number of bits to be employed from the bit bank is thus 1.5* the number of spectral values of the frequency group in the example.

Another embodiment of the present invention provides for the synchronization of the output and input bit timing.

In encoding systems having a random ratio of input to output bit timing, the problem arises that the number of bits to be allocated may be an infinite fraction. This would exclude synchronization by means of extended averaging of the number of bits to be allocated, which would be possible with a finite fraction. A divergence of input and output is prevented by a control means, which monitors the interval between input and output pointer of a buffer. If the interval grows smaller, the number of bits is reduced and vice versa. If the ratio of input to output bit timing is constant, or if the ratio of input to output bit timing is varied by a constant mean value, it suffices if the number of bits to be allocated varies by 1 bit respectively. The maximum deviation from the mean value, however, determines the minimum size of the buffer to be provided. This shall be made more apparent with FIG. 4 using a concrete OCF implementation:

The input data are scanned values supplied with a constant frequency. The output is connected to a channel having a constant bit rate. In this way, a constant mean ratio of input no output bit timing is predetermined. The number of bits to be passed on to the output per block may vary in the encoder contingent upon the bit bank. That is to say, there are blocks for which more or less than the average bit number at disposal (==input bit timing/output bit timing*block length), which may be an unnatural number, is passed on to the output. This variation is compensated for by a FIFO (ring buffer) at the output. The length of the FIFO is selected according to the maximum content of the bit bank. If the average number of bits at disposal per block is an unnatural number, either the next larger, respectively the next smaller, number of bits per block must be allocated. If the next larger, respectively, next smaller number is selected, the FIFO input and output pointers will converge or diverge. About the set interval now set intervals in both directions are defined, when they are exceeded switching from the next larger to the next smaller one (or vice versa) occurs. In this case, one of these two approximations is prescribed as the starting value for the number of bits to be allocated. If the size of the buffer is sufficient, this control means may also be utilized to determine this starting value. In connection with the bit bank, the contents of the bit bank must be taken into account prior to pointer comparison.

If the number of bits varies by more than one bit, this process may also be applied if no constant mean value is at hand. In this event, the correction number of bits is calculated from the difference between the pointers.

Other embodiments of the invention improve the remasking. In accordance with the present invention, the signal energy in the preceding data blocks is included in the calculation of the permissible disturbance, in that the permissible disturbance decreases an the most by a predetermined factor from one block to the next following consideration of all other parameters for determining the current permissible disturbance.

This too shall be made more apparent in the following section using an example.

The permissible disturbance in frequency group 1 equals 20 in block 1. In block 2, the signal energy equals 50 in FG1. If the permissible disturbance is presumed 0.1* energy in the frequency group, the permissible disturbance equals 5. If the "remasking factor" is assumed −3 dB per block, this corresponds to halving the energy, the permissible disturbance in the block is calculated 10(=0.5*20).

Furthermore, adaption to different bit rates is possible.

The iteration block of the OCF distributes the number of bits at disposal for the block according to the given "permissible disturbance" per frequency group. In order to optimize the results, the calculation of the "permissible disturbance" is adapted to the number of bits at disposal. The point of departure is in this case the actual hearing threshold, which is not transpassed yet with a "permissible disturbance" of ESO. The disturbance interval required for a specific bit rate is selected in such a manner that on the average a uniform course of the disturbance spectrum is attained. The lower the overall number of bits to be allocated, the smaller is the disturbance interval required per group. Although the calculated hearing threshold is transpassed in an increasing number of blocks with increasingly lower bit rates, on the whole a uniform disturbance course is attained. On the other hand, with higher bit rates, an additional safety gap to the hearing threshold may be obtained, which by way of illustration permits reprocessing or multiple encoding/decoding of the signal.

As a further measure, wideband limitation may be carried out by deleting specific frequency ranges prior to calculating the "permissible disturbance". This may occur statically or dynamically, if the required disturbance interval is only poorly held in several consecutive blocks.

In the event of a steep decline of the masking down toward low frequencies, i.e. in calculating the permissible disturbance, it is especially important to take into consideration that there is only a small masking effect from high to low frequencies. The permissible disturbance calculated in the first approximation is therefore corrected downward in the event of a sharp rise in energy in the spectrum for the frequency groups below the rise.

Furthermore, an element of the present invention is that the quantization characteristic curve is improved.

The statistics of unquantized values are reflected in the quantization and reconstruction. This decreases in a strictly monotonous manner in a curved characteristic curve. In this way, the anticipated value of each quantization interval is moved not toward the center of the interval, but closer to the smaller values (FIG. 5).

There are two possible ways of maintaining the smallest quantization error:

a) Given the characteristic curve of a quantization: the anticipated value for each quantization interval is determined using the characteristic curve of the quantization and the statistic distribution of the values to be quantized and is utilized as a table for reconstruction in the decoder. The advantage of this procedure lies in the simple realizability and the little amount of the calculation in the encoder and decoder.

b) Given the characteristic curve of the reconstruction: using this curve the characteristic curve of a quantizer may be calculated and a model for the probability distribution of the input values, for which the anticipated value of each quantization interval corresponds exactly to the reconstructed value of this interval. This has the advantage that no tables are required in the decoder and the characteristic curve of the quantization can be adapted to the current statistics in the decoder without having to instruct the decoder.

c) Given a characteristic curve of the quantizer and the calculation of the characteristic curve of the reconstruction for each value: if the characteristic curve of the quantizer and a function for the probability distribution for the input data is given, the decoder can calculate the reconstruction value therefrom respectively. This has the advantage that no tables are required for reconstruction in the decoder. A disadvantage of this procedure is the greater amount of the calculation in the decoder.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A digital coding process for at least one of transmitting and storing acoustical signals, the process comprising the steps of:

sampling an acoustical signal to obtain samples;

transforming the samples of said acoustical signal using a transform/filter bank into a sequence of second samples to thereby reproduce a spectral composition of said acoustical signal;

quantizing said sequence of second samples in accordance with the requirements with varying precision;

at least partially coding said sequence of second samples using an optimum encoder, and in which a corresponding decoding and inverse transformation takes place during reproduction of the acoustical signal;

correlating the occurrence probability of the quantized spectral coefficient to the length of the code utilizing a code in such a way that the more frequently said spectral coefficient occurs, the shorter the code word; and allocating a code word to several elements of said sequence or to a value range to thereby reduce the size of the table of said encoder;

wherein the allocating step further comprising the steps of:

directly assigning a code word to only one part of the value range of an element of said sequence; and assigning all values lying outside said partial range a common identifier and a special code.

2. A coding process according to claim 1, wherein a Huffman code is utilized as said encoder.

3. A coding process according to claim 2, wherein said special code is carried out using a PCM code.

4. A coding process according to claim 1, further comprising the step of:

combining n spectral coefficients with n being greater than or equal to 2 up to a n-tupel; and encoding together the n spectral coefficients by assigning a code word.

5. A coding process according to claim 4, wherein the spectral coefficients of successive blocks, in particular, having the same number are combined from successive blocks to form a pair, respectively an n-tupel, and are encoded together by assigning a code word.

6. A coding process operating in accordance with an optimum coding in a frequency domain (OCF) process according to claim 1, wherein an overall amplification factor which forms side information that is transmitted to a receiver is calculated from the values of the number of iterations for an initial quantization step level, from a value for the non-uniformity of the spectrum, and from other level information from the calculation.

7. A coding process according to claim 6, further comprising the steps of:

gathering and transmitting together side information on changes in the quantization step in order to stay within a permissible disturbance for more than one block.

8. A coding process according to claim 7, wherein the encoding of said side information occurs with a variable length code.

9. A coding process according to claim 1, further comprising the steps of:

utilizing different code tables depending on the sequence;

transmitting the number of the utilized code tables; and storing or transmitting the number together with the encoded values.

10. A coding process according to claim 9, further comprising the steps of:

utilizing different code tables for different spectral ranges; and setting borders between the different spectral ranges dependent upon the signal.

11. A coding process according to claim 10, wherein a table is utilized for decoding, in which pairs of values are stored, of which the first value of the pair contains an address which is the next pointer into the table in case a "0" has been decoded, the second value of said pair contains the next pointer into the table in case a "1" has been decoded and entries flagged not to contain an address contain the target codeword itself.

12. A coding process according to claim 1, further comprising the steps of:
   transmitting, in order to determine the beginning of a next block of information in the event of a transmission error, a block commencement mark and a length of an entropy code.

13. A coding process according to claim 1, further comprising the step of adapting quantization and reconstruction to each other in such a manner that the mean quantization error is minimized.

14. A coding process according to claim 13, wherein the calculation of the reconstruction values takes place in a receiver using a table, which was compiled by determining expectancy value of the input values of a quantization interval.

15. A coding process according to claim 13, wherein said quantization takes place via a table, which was calculated from the characteristic curve of the reconstruction and the probability distribution of the input data.

16. A coding process according to claim 13, wherein, for reconstructing by means of the characteristics curve of a quantization and a probability distribution of the input data, a reconstruction value is calculated in a decoder for each individual quantized value in such a manner that the quantization error is minimized.

17. A process according to claim 1 further comprising the step of reproducing the stored signal using a corresponding decoding and a reverse transformation or a reverse filter bank.

18. A digital coding process for at least one of transmitting and storing acoustical signals, the process comprising the steps of:
   sampling an acoustical signal to obtain samples;
   transforming the samples of said acoustical signal using a transform/filter bank into a sequence of second samples to thereby reproduce a spectral composition of said acoustical signal;
   quantizing said sequence of second samples in accordance with the requirements with varying precision;
   at least partially encoding said sequence of second samples using an optimum encoder, and in which a corresponding decoding and inverse transformation takes place during reproduction of the acoustical signal;
   arranging one part of the variable length code words in a raster, and
   distributing the remaining code words in the remaining gaps so that the beginning of a code word is more easily found;
   wherein the process further comprises the steps of:
   utilizing an equidistant raster in order to improve reliability of a transmission of continuously successive information of varying degrees of importance, a raster length of which corresponds to a mean length of the information to be transmitted;
   arranging most important portions of said information in the raster; and
   transmitting a position of less important information in said raster in addition to said most important portions of information if necessary.

19. A digital coding process for at least one transmitting and storing acoustical signals, the process comprising the steps of:
   sampling an acoustical signal to obtain scanned values;
   transforming the samples of said acoustical signal using a transform/filter bank into a sequence of second samples to thereby reproduce a spectral composition of said acoustical signal;
   quantizing said sequence of second samples in accordance with the requirements with varying precision;
   at least partially encoding said sequence of second samples using an optimum encoder, and in which a corresponding decoding and inverse transformation takes place during reproduction of the acoustical signal; and
   wherein the sequence of second samples are divided into data blocks corresponding to time periods of a given length, and further comprising calculating a permissible disturbance of the data blocks by using a time period which is one of: 1) longer than the given length; and 2) a function of results of previous time periods; and
   wherein, in order to calculate said permissible disturbance for a block, an analysis of the signal is conducted in different frequency groups, and respective values of a preceding block, which have been corrected by an omission factor, and values of the current block, are both drawn upon for calculating said permissible disturbance.

20. A coding process according to claim 19, wherein, in order to calculate said permissible disturbance for a block, energy values of the last block are utilized in such a manner that values of lower amplitude following values of higher amplitude require less precise quantization.

21. A coding process according to claim 19, wherein if a sharp rise in energy toward high frequencies is detected, the calculated permissible disturbance is reduced for a frequency group below the rise.

22. A digital coding process for at least one of transmitting and storing acoustical signals, the process comprising the steps of:
   sampling an acoustical signal to obtain samples;
   transforming the samples of said acoustical signal using a transform/filter bank into a sequence of second samples to thereby reproduce a spectral composition of said acoustical signal;
   quantizing said sequence of second samples in accordance with the requirements with varying precision;
   at least partially encoding said sequence of second samples using an optimum encoder, and in which a corresponding decoding and inverse transformation takes place during reproduction of the acoustical signal; and
   wherein, although a constant data rate is maintained, the number of bits for use by a block may deviate from an average data rate depending on the signal characteristics, on the capacity of the transmission channel, or in order to simplify the encoding; and
   wherein a number of bits at disposal for encoding a data block is altered contingent on the signal characteristics in such a manner, that on the average a constant data rate is maintained, and the deviation of sums from this mean value is not higher than a specific previously fixed value and not less than another previously fixed value.

23. A process according to claim 19 further comprising the step of reproducing the stored signal using a corresponding decoding and a reverse transformation or a reverse filter bank.

24. A coding process according to claim 22, wherein in order to synchronize coding processes having a random ratio of input to output bit timing, a load level of a buffer read out with an output bit timing is used to determine the number of bits to be allocated.

25. A coding process according to claim 24, wherein a number of bits at disposal for encoding a data block is altered contingent on the signal characteristics in such a manner that signal blocks having a greater distance between the signal energy in the individual frequency groups and the respective permissible disturbance are given a greater number of bits (current data rate) at disposal than signal blocks having a smaller distance.

26. A coding process according to claim 25, wherein the number of bits transmitted on the same channel required by the side information is subtracted from the bits at disposal for a block.

27. A coding process according to claim 26, wherein, if a special bit combination is employed for a synchronizing word for block synchronization, said synchronizing word and all bit combinations, which by chance are identical to the synchronizing word, are distinguished from one another with an intentionally added supplementary bit.

28. A coding process according to claim 25, wherein any ranges, in which said permissible disturbance is greater than said signal energy, are deleted.

29. A coding process according to claim 28, wherein a resulting sequence of deleted values is encoded with a bit in the side information.

30. A coding process according to claim 29, wherein said resulting sequence of deleted values is encoded in said side information with a value in the table of possible quantization step levels for each frequency group.

31. A coding process according to claim 22, wherein an outer iteration loop is interrupted in the event an inner loop cannot be ended with certainty within the maximum number of iterations.

32. A process according to claim 22 further comprising the step of reproducing the stored signal using a corresponding decoding and a reverse transformation or a reverse filter bank.

* * * * *